Oct. 8, 1957 A. H. DICKINSON 2,809,304

TRANSISTOR CIRCUITS

Filed April 15, 1954

INVENTOR.
ARTHUR H. DICKINSON
BY P. E. Henninger
ATTORNEY

United States Patent Office 2,809,304

Patented Oct. 8, 1957

2,809,304

TRANSISTOR CIRCUITS

Arthur H. Dickinson, Greenwich, Conn., assignor to International Business Machines Corporation, New York, N. Y., a corporation of New York Application April 15, 1954, Serial No. 423,491

7 Claims. (Cl. 307—88.5)

Figure 1:
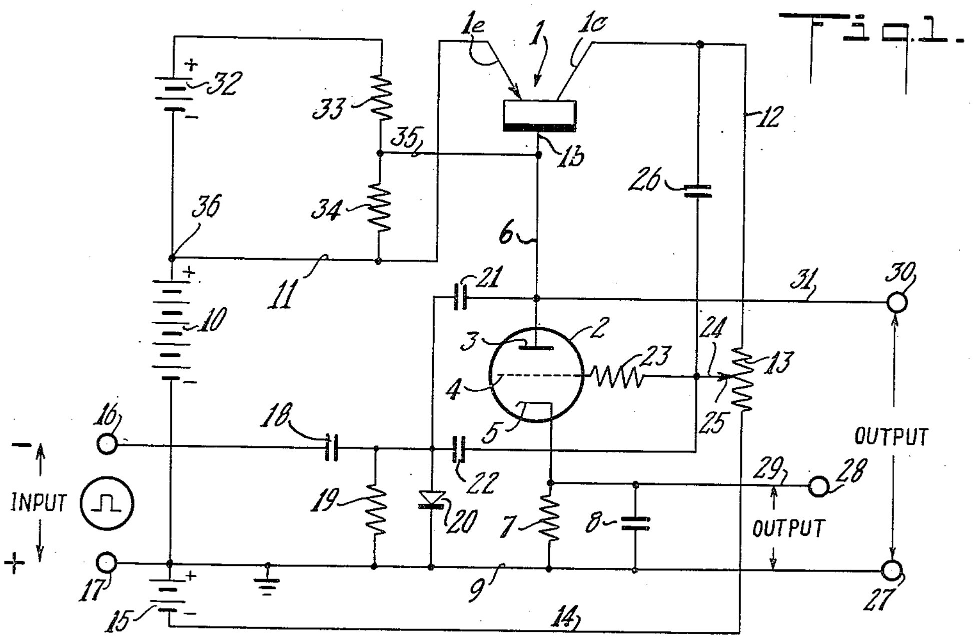

This invention relates to transistor circuits, and particularly to trigger circuits of the type including a vacuum tube connected in series with the base of the transistor.

A switching circuit may be defined as a circuit having an output which shifts suddenly between separated values of electrical quantities. If a switching circuit has two stable output states, in either of which it will remain indefinitely once it is established there, it is known as a bistable circuit. The term "trigger circuit" is sometimes used synonymously with "bistable circuit." More frequently, the term "trigger circuit" is used to identify a bistable circuit having a single set of input terminals, which is switched back and forth between its two output states by means of successive signals received at those input terminals. When the term "trigger circuit" is used in this manner, it is to be distinguished from a latch circuit, which is a bistable circuit having two sets of input terminals, and which is switched from one stable set to the other by a signal impulse at one terminal and switched back from the other state to the one state by a signal at the opposite set of input terminals.

Where a trigger circuit is switched from one state to the other and back again in response to two successive signal impulses of the same polarity applied at the same set of input terminals, it is spoken of as a scaling trigger circuit or sometimes as a binary trigger circuit. The present invention relates particularly to such scaling trigger circuits.

There are disclosed in my copending application Ser. No. 177,446, filed August 3, 1950, entitled: "Electronic Amplifier," certain trigger circuits which employ both a transistor and a vacuum tube connected in series with the transistor base. In such circuits, the emitter current is the sum of the base current and the collector current. The collector can receive current only through the emitter, because of the presence of the asymmetrically conductive tube in series with the base, which prevents current flow through the base toward the collector. In the circuits disclosed in my copending application, a feedback is provided between a load resistor in series with the collector and the grid of the tube, so that an increase in the collector current tends to increase the base current and a decrease in the collector current tends to decrease the base current. The variation in the base current produces a corresponding variation in the emitter current, with a following variation in the collector current. Consequently, the circuit operates in one of two stable states. In one such state, referred to as the "off" state, the tube is cut off, and the emitter current equals the collector current, which is very low. In the other state referred to as the "on" state, the emitter is conducting current at substantially its maximum capacity, and the tube and the collector are also conducting their maximum current. The system is switched back and forth between these two "on" and "off" states by means of a series of input signal pulses of the same polarity, which are fed simultaneously into two points in the circuit. One of these points is the grid of the tube and the other is the base of the transistor. The signal supplied to the transistor base is effective when the circuit is in its "off" condition to start an increase in the emitter current with a following increase in the collector current and hence in the tube current so as to switch the circuit to its "on" condition. The signal transmitted to the grid of the tube is ineffective when the tube is cut off. After the tube circuit is transferred to its "on" condition, the next input signal pulse is ineffective at the transistor base, since the emitter is already carrying substantially its maximum current. The signal supplied to the grid of the tube is then effective to initiate a decrease in the tube current with following decreases in the emitter and collector current, thereby starting a cumulative process which is effective to switch the circuit back to its "off" condition.

Transistor characteristics vary considerably from one transistor to another, and the characteristics of a given transistor vary with time. It is therefore an ever present problem in connection with transistors to provide circuits which will not be sensitive to such variations in characteristics. While the circuits of the prior application are not, as transistor circuits go, particularly sensitive to such variations, it is nevertheless highly desirable to improve the circuits further from that standpoint.

The circuits of my prior application have a continuous small value of current flow, even in the "off" state. This small current flow produces an undesirable power loss and also limits the output signals available, i. e., it limits the difference obtainable between the maximum and minimum output conditions.

It is an object of the present invention to provide an improved transistor circuit. Another object is to provide an improved scaling trigger circuit.

A further object is to provide an improved circuit of the type described in which the sensitivity of the circuit to variations in the transistor characteristics is reduced as compared to the circuits of the prior art.

A further object is to provide an improved trigger circuit including a transistor and a vacuum tube connected in series with the transistor base electrode.

A further object of the invention is to provide a circuit of the type described having increased output capacity, i. e., a greater difference between the electrical output conditions in the "on" and "off" states.

A further object is to provide a circuit of the type described which will have substantially zero power consumption in the "off" state.

The foregoing and other objects of the invention are attained, in the circuits described herein, by providing a special biasing circuit for the base and emitter of the transistor. This biasing circuit includes a biasing battery having two voltage dividing resistors connected in series across its terminals. The negative terminal of the biasing battery is connected to the positive terminal of the battery which supplies current to the emitter. The mid-point of the voltage divider is connected to the base of the transistor.

When the tube is in its "off" condition, the voltage divider circuit is effective to bias the base substantially with respect to the emitter in a sense to inhibit the injection of current carriers from the emitter, thereby reducing the emitter current substantially to zero. When the tube is conducting a current, part of the plate current of the tube flows from one terminal of the emitter current supplying battery through one resistor of the voltage divider, in a direction to reduce the potential of the mid-point of the voltage divider below that of said one terminal of the emitter current supplying battery, thereby biasing the base in a sense to promote the injection of current carriers by the emitter.

The biasing circuit is thereby effective to reduce the output current in the "off" state, and to increase to some extent the output current in the "on" state. An increased differential between the output electrical conditions in the "on" and "off" states is thereby provided. The power consumption in the "off" state is practically eliminated, and the resulting circuit is much less sensitive to variations in the transistor characteristics. This is particularly true insofar as such variations may affect the current flow in the "off" state of the circuit.

Other objects and advantages of my invention will become apparent from a consideration of the following specification taken together with the accompanying claims and drawing.

Figure 2:
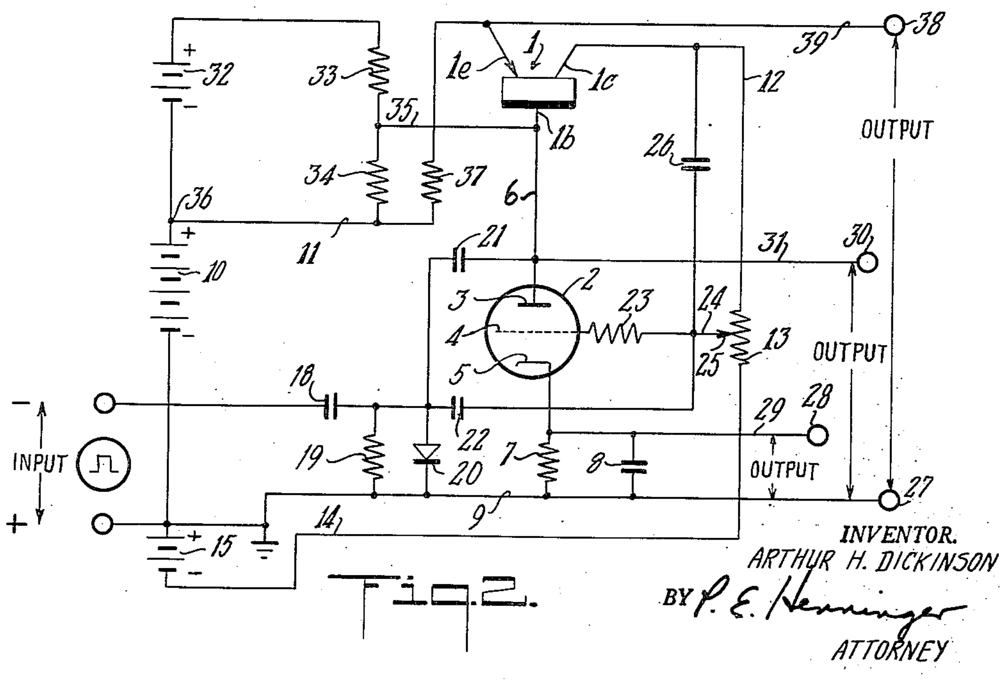

In the drawing:

Fig. 1 is a wiring diagram of one form of transistor circuit employing the invention, and Fig. 2 is a wiring diagram of a modified form of transistor circuit embodying the invention.

There are only slight differences between the circuits of Figs. 1 and 2, and the same reference numerals have been used to indicate corresponding parts in both circuits.

Referring to Fig. 1, there is shown a transistor 1 having an emitter electrode 1*e*, a collector electrode 1*c* and a base electrode 1*b*. It is assumed that the transistor 1 has a body of n-type semi-conductive material, although it will be readily understood that the invention is equally applicable to transistors having bodies of p-type material, with appropriate changes in polarities, etc. An electric discharge device 2, shown as a triode including an anode 3, a control electrode 4 and a cathode 5 has its anode 3 connected directly to the base 1*b* through a conductor 6. Cathode 5 is connected through a resistor 7 and a parallel capacitor 8 to a grounded conductor 9.

Current for the emitter 1*e* is supplied by a battery 10 having its negative terminal connected to the grounded conductor 9 and its positive terminal connected to emitter 1*e* through wire 11.

Because of the presence of the asymmetrically conductive triode 2, current may flow through the base electrode 1*b* only in the direction toward the grounded wire 9. Because of the asymmetrically conductive nature and the bias of emitter 1*e*, current may flow through it only in the direction toward the body of the transistor. Consequently, the current through emitter 1*e* is the sum of the base and collector currents. The base current flows through a circuit which may be traced from the positive terminal of battery 10 through wire 11, emitter 1*e*, base 1*b*, wire 6, anode 3, cathode 5, resistor 7 and wire 9 back to the negative terminal of battery 10. The collector current flows through a circuit which may be traced from the positive terminal of battery 10 through wire 11, emitter 1*e*, collector 1*c*, a wire 12, a load resistor 13, a wire 14, and a battery 15, to the negative terminal of battery 10.

Input signal pulses of the square wave or step type are supplied through input terminals 16 and 17. Input terminal 17 is connected to grounded wire 9. The polarity of the input pulses is such that during an input signal pulse terminal 16 is negative with respect to terminal 17, as indicated by the legend in the drawing. These input pulses are impressed across a capacitor 18 in series with a resistor 19 and a parallel diode 20. These elements cooperate in a well-known manner to shunt the leading edge of the pulses, so that only the trailing edges are transmitted to the trigger circuit. These trailing edges are transmitted through a capacitor 21 to the wire 6, and base 1*b* and through a capacitor 22 and a resistor 23 to the control electrode 4 of triode 2. Control electrode 4 is also connected through resistor 23 and a wire 24 to a movable tap 25 on the load resistor 13. A capacitor 26 is connected between wire 24 and collector 1*c*.

Output pulses may be taken from output terminal 27 connected to grounded wire 9 and either an output terminal 28 connected through a wire 29 to the cathode 5 or an output terminal 30 connected through a wire 31 to wire 6.

The circuit as thus far described is substantially the same as that shown in my copending application, previously mentioned, except for the addition of the resistor 23 which functions as an oscillation suppressing resistance in a manner well known in the art.

The present invention is concerned with a novel biasing circuit for the transistor 1, which includes a battery 32 having connected across its terminals a voltage divider including two resistors 33 and 34 in series. The common terminal of the resistors 33 and 34 is connected through a wire 35 to base 1*b*. The negative terminal of battery 32 is connected to the positive terminal of battery 10 at junction 36.

OPERATION OF FIG. 1

When the circuit is in its "off" condition, no current is flowing through triode 2. The only current flowing through resistors 33 and 34 is that supplied by battery 32 so that the common terminal of those resistors is then positive with respect to junction 36 and hence with respect to emitter 1*e*. This common terminal is connected through wire 35 to base 1*b*, so that the base 1*b* is biased positively with respect to emitter 1*e*. If the body of transistor 1 is of n-type semi-conductive material, as has been assumed, then this positive potential on base 1*b* effectively blocks all current from the emitter 1*e*. Some current will flow through collector 1*c* because of this positive potential on the base, but it will be small in value, since it will be flowing in the high impedance direction through collector 1*c*. The setting of tap 25 on resistor 13 is adjusted so that triode 3 is biased to cutoff.

With the foregoing "off" state established, assume that a signal pulse is received at the input terminals 16 and 17. When the trailing edge of this pulse is transmitted through condenser 22 and resistor 23 to grid 4, it appears there as a negative pulse, which has substantially no effect on the conductivity of triode 2, since that triode is already biased to cut-off by the current flow through resistor 13.

When this input signal passes through capacitor 21 to wire 6 it swings base 1*b* negatively, and thereby produces a flow of emitter current from battery 10 through wire 6 and capacitor 21. This flow of emitter current produces an increased collector current, thereby increasing the potential drop through resistor 13, and raising the potential of tap 25, which is communicated through wire 24 and resistor 23, to control electrode 40 so as to make the triode 2 conductive. When triode 2 becomes conductive, it produces a further increase in emitter current flow, with a consequent further increase in collector current flow and a following further increase in the potential of control electrode 4. This cumulative process continues until the circuit shifts to its "on" state.

As the signal pulse passes through capacitor 21 and as the tube becomes conductive, a portion of the current necessary to supply the condenser 21 and the tube 2 comes from battery 10 through resistor 34 and wire 35. This current flowing through resistor 34 tends to make wire 35 negative with respect to junction 36 and hence negative with respect to emitter 1*e*. This negative potential is applied to the base electrode 1*b* and therefore biases the base with a polarity tending to increase the flow of emitter current, thereby producing a further cumulative effect and further increasing the final value of collector current. While some of the current through the tube 2 is supplied by battery 32 through resistor 33, this has no substantial effect on the potential of base 1*b*, the latter being determined particularly by the flow of current from battery 10 through resistor 34.

The capacitor 26 is provided to hold the cut-off biasing potential on the control electrode 4 against the tendency of the input signal pulse through condenser 22 to lower that potential further when the tube 2 is already cut off. In other words, the condenser 26 is effective when the circuit is in its "off" state to prevent the signal pulse transmitted through capacitor 22 from holding the circuit in its "off" state.

After the circuit has become established in its "on" state, let it be assumed that another input signal of the same wave shape and polarity is transmitted through input terminals 16 and 17. The trailing edge of this signal is transmitted through capacitors 21 and 22 to base **1*b* and control electrode 4, respectively, where it appears as a negative pulse. Under present conditions, the pulse transmitted through capacitor 21 is not effective to increase substantially the emitter current, since the emitter is already substantially saturated. The pulse transmitted through condenser 22 becomes effective to lower the potential of control electrode 4, thereby reducing the base current through transistor 1 and consequently the emitter current. This reduction in the emitter current produces a consequent reduction in the collector current which is effective through resistor 13 and wire 24 to bias the control electrode 4 more negatively, thereby further reducing the base current. A cumulative process is again set up, which continues until the tube 2 is cut off and the circuit is again established in its "off" state. The biasing battery 32 and resistors 33 and 34 contribute to this cumulative process by swinging the potential of base 1*b* in a positive direction, thereby decreasing the current flow through transistor 1**.

The capacitor 8 is effective during the transfer from the "on" to the "off" condition to hold the cathode 5 at the potential which it had during the "on" condition, thereby making the reduction in the potential of control electrode 4 more rapidly effective to cut off the flow of current through the tube 2.

It should be apparent from the foregoing that in the "off" state of the transistor, the emitter current is substantially zero. Consequently, the power consumption of the circuit is lower than in the previous circuits, and the available output is greater. Furthermore, the circuit shown is considerably less sensitive to variation in the characteristics of the transistor, since its base potential is controlled at all times by impedances which are independent of the transistor impedance.

The tube in the circuit just described functions as a variable impedance means to control the flow of current through the transistor. There are many advantages in the use of a tube for this variable impedance means, especially with regard to the stability of the characteristics of currently commercially available tubes. However, it is within the broader aspects of the invention to use some other electric translating device having similar variable impedance characteristics in place of tube 2. For example, such an alternative translating device might be another transistor.

FIG. 2

The circuit in Fig. 2 is the same as that of Fig. 1 except that an additional resistor 37 is connected in series with the emitter electrode **1*e*. Resistor 37 is effective in the "on" condition of the circuit to increase the resistance in the anode load circuit of the tube. Consequently, the anode potential drops to a lower value when the tube is conducting. The output signal, when taken across terminals 27 and 30, may be increased by approximately 30% in the circuit of Fig. 2 as compared to the circuit of Fig. 1. Furthermore, it is possible in the circuit of Fig. 2 to take the output signal from grounded terminal 27 and a terminal 38 connected through a wire 39 to emitter electrode 1*e***, providing an even greater output potential.

The following table shows, by way of example, a particular set of values for the potentials of the various batteries and for the impedances of the various resistors, in a circuit which has been operated successfully. It will be understood that these values are set forth by way of example only and that the invention is not limited to these values or any of them. No values are given for the asymmetric impedance elements, which may be considered to have substantially zero impedance in their forward direction and substantially infinite impedance in their reverse direction.

*Table I*

| | |
|---|---|
| Transistor 1 | N–type transistor. |
| Triode 2 | 5687 tube. |
| Resistor 7 | 560 ohms. |
| Capacitor 8 | 0.02 $\mu$f. |
| Battery 10 | 63 volts. |
| Resistor 13 | 350,000 ohms. |
| Battery 15 | 30 volts. |
| Capacitor 18 | 0.05 $\mu$f. |
| Diode 20 | 1N48 crystal diode. |
| Capacitor 21 | 0.003 $\mu$f. |
| Capacitor 22 | 56 $\mu\mu$f. |
| Resistor 23 | 200 ohms. |
| Capacitor 26 | 0.001 $\mu$f. |
| Battery 32 | 22 volts. |
| Resistor 33 | 3000 ohms. |
| Resistors 34 and 19 | 10,000 ohms. |
| Resistor 37 | Zero to 1000 ohms. |

I claim:

1. An electric circuit comprising a transistor having emitter and base electrodes, first and second sources of unidirectional electrical energy, means including a junction connecting one terminal of the first source to the terminal of opposite polarity of the second source, means connecting the emitter to said junction so that one source tends to inject minority current carriers into the transistor, variable impedance means connected between the base electrode and the opposite terminal of said one source, a load resistor, means including said load resistor connecting the collector electrode and the opposite terminal of said one source, a voltage divider connected across the other source, and means connecting an intermediate point on said voltage divider to said base electrode, said other source and the voltage divider cooperating when the impedance of the variable impedance means is high to bias the base in a sense to inhibit injection of carriers from the emitter, said first source being effective when the impedance of the variable impedance means is low to send a current through a portion of said voltage divider and thence through said variable impedance means, said last-mentioned current being effective to produce a potential drop in said voltage divider portion and thereby to bias the base in a sense to promote injection of carriers from the emitter.

2. A trigger circuit comprising a transistor having emitter, collector and base electrodes, a tube having an anode, a cathode and a control electrode, a first source of unidirectional electrical energy, means connecting the emitter to the positive terminal of said source, means connecting the anode of the tube to the base electrode, means connecting the cathode of the tube to the negative terminal of said source, a load resistor, means including said load resistor connecting the collector electrode to the negative terminal of said source, so that the current flowing through said emitter electrode passes through the load resistor in parallel with the anode and cathode of the tube, feedback means connecting a point on said load resistor to said control electrode, said feedback means being effective upon an increase in current flow through the load resistor to increase the current flow through the tube and thereby the emitter and collector currents, a second source of unidirectional electrical energy, a voltage divider connected across said second source, means connecting the negative terminal of said second source to said emitter, and means connecting an intermediate point on said voltage divider to said base electrode, said second scurce and said voltage divider cooperating when the tube is non-conductive to bias said base positively with respect to the emitter, said first source being effective when the tube is conductive to send a current through a portion of said voltage divider to said anode and thereby to produce a potential drop in said voltage divider portion to bias the base negatively with respect to the emitter electrode.

3. A scaling trigger circuit comprising a transistor having emitter, collector and base electrodes, a tube having an anode, a cathode and a control electrode, a first source of unidirectional electrical energy, means connecting the emitter to the positive terminal of said source, means connecting the anode of the tube to the base electrode, means connecting the cathode of the tube to the negative terminal of said source, a load resistor, means including said load resistor connecting the collector electrode to the negative terminal of said source, so that the current flowing through said emitter electrode passes through the load resistor in parallel with the anode and cathode of the tube, feedback means connecting a point on said load resistor to said control electrode, said feedback means being effective upon an increase in current flow through the load resistor to increase the current flow through the tube and thereby the emitter and collector currents, a second source of unidirectional electrical energy, a voltage divider connected across said second source, means connecting the negative terminal of said second source to said emitter, means connecting an intermediate point on said voltage divider to said base electrode, said second source and said voltage divider cooperating when the tube is non-conductive to bias said base positively with respect to the emitter, said first source being effective when the tube is conductive to send a current through a portion of said voltage divider to said anode and thereby to produce a potential drop in said voltage divider portion to bias the base negatively with respect to the emitter electrode, input means effective to transmit successive negative signal pulses to said base electrode and to said control electrode, and output terminals connected respectively to the negative terminal of said first source and to a point in the anode circuit of the tube electrically spaced therefrom.

4. A scaling trigger circuit as defined in claim 3, including a resistor connected in series with said emitter.

5. A scaling trigger circuit as defined in claim 4, in which one of said output terminals is connected to said emitter.

6. An electric circuit comprising a transistor having emitter, collector and base electrodes, first and second sources of unidirectional electrical energy, means including a junction connecting one terminal of the first source to the terminal of opposite polarity of the second source, means connecting the emitter to said junction so that one source tends to inject minority current carriers into the transistor, variable impedance means connected between the base electrode and the opposite terminal of said one source, a voltage divider connected across the other source, means connecting an intermediate point on said voltage divider to said base electrode, said other source and the voltage divider cooperating when the impedance of the variable impedance means is high to bias the base in a sense to inhibit injection of carriers from the emitter, said first source being effective when the impedance of the variable impedance means is low to send a current through a portion of said voltage divider and thence through said variable impedance means, said last-mentioned current being effective to produce a potential drop in said voltage divider portion and thereby to bias the base in a sense to promote injection of carriers from the emitter, a load branch circuit comprising load impedance means and connecting said collector electrode to said opposite terminal of said one source, positive feedback means connecting said load impedance means and said variable impedance means and effective to vary the impedance of said variable impedance means inversely with the current flow through said load impedance means, and means effective to initiate a variation in the current flow through said load impedance means.

7. An electric circuit as defined in claim 6, in which said variable impedance means comprises a vacuum tube having an anode, cathode and a control electrode, said anode and cathode being connected in series with said base electrode, and said positive feedback means includes a connection between said load impedance means and said control electrode.

References Cited in the file of this patent

UNITED STATES PATENTS

| | | |
|---|---|---|
| 2,579,336 | Rack | Dec. 18, 1951 |
| 2,620,448 | Wallace | Dec. 2, 1952 |
| 2,623,170 | Dickinson | Dec. 23, 1952 |
| 2,628,310 | Wood | Feb. 10, 1953 |
| 2,629,833 | Trent | Feb. 24, 1953 |
| 2,663,806 | Darlington | Dec. 22, 1953 |